US 8,339,032 B2

(12) United States Patent
Jansen

(10) Patent No.: US 8,339,032 B2
(45) Date of Patent: *Dec. 25, 2012

(54) LIGHT SOURCE WITH LUMINOPHORE LAYER

(75) Inventor: Martin Jansen, Leonberg (DE)

(73) Assignee: Max-Planck-Gesellschaft zur Förderung der Wissenschaften e.V., Munich (DE)

( * ) Notice: Subject to any disclaimer, the term of this patent is extended or adjusted under 35 U.S.C. 154(b) by 395 days.

This patent is subject to a terminal disclaimer.

(21) Appl. No.: 12/513,465

(22) PCT Filed: Oct. 31, 2007

(86) PCT No.: PCT/EP2007/009471
§ 371 (c)(1),
(2), (4) Date: May 4, 2009

(87) PCT Pub. No.: WO2008/052772
PCT Pub. Date: May 8, 2008

(65) Prior Publication Data
US 2010/0067215 A1    Mar. 18, 2010

(30) Foreign Application Priority Data
Nov. 2, 2006 (DE) .................. 10 2006 051 756

(51) Int. Cl.
*H01J 1/62* (2006.01)
*H01J 63/04* (2006.01)
(52) U.S. Cl. ................... 313/503; 313/498; 445/24
(58) Field of Classification Search ............. 313/483, 313/486, 496, 503, 504; 445/23–24, 26–27
See application file for complete search history.

(56) References Cited

U.S. PATENT DOCUMENTS

| 5,543,485 | A | 8/1996 | Baldus |
| 6,717,355 | B2 * | 4/2004 | Takahashi et al. ............ 313/503 |
| 7,938,983 | B2 | 5/2011 | Mueller-Mach et al. |
| 2003/0052595 | A1 | 3/2003 | Ellens et al. |
| 2006/0038477 | A1 * | 2/2006 | Tamaki et al. ................ 313/485 |
| 2010/0012897 | A1 * | 1/2010 | Jansen et al. ............ 252/301.4 F |

FOREIGN PATENT DOCUMENTS

| DE | 195 30 390 A1 | 2/1997 |
| EP | 1223208 A1 | 7/2002 |
| EP | 1 696 016 A1 | 8/2006 |
| JP | 2003-298116 A | 10/2003 |
| JP | 2006-306982 A | 11/2006 |
| WO | 98/12757 A1 | 3/1998 |
| WO | 02/22624 A1 | 3/2002 |
| WO | 2005/049763 A1 | 6/2005 |
| WO | 2006/061778 A1 | 6/2006 |

OTHER PUBLICATIONS

Baldus et al., 2003, "Novel High-Performance Ceramics—Amorphous Inorganic Networks from Molecular Precursors," Angewandte Chemie, 36(4):328-343.
PCT International Search Report for PCT/EP2007/009471 dated Jan. 2, 2008 (7 pages).

* cited by examiner

*Primary Examiner* — Anh Mai
*Assistant Examiner* — Kevin Quarterman
(74) *Attorney, Agent, or Firm* — Sutherland Asbill & Brennan LLP

(57) ABSTRACT

The invention relates to a light source comprising a primary radiation source and a luminescent substance, and to a method for producing this light source. The invention relates, in particular, to a method for producing an electric light source using one or more luminescent substances emitting in the visible spectrum range, and at least one primary source emitting preferably in the UV range, and which is preferably, but not exclusively, an LED.

22 Claims, No Drawings

LIGHT SOURCE WITH LUMINOPHORE LAYER

CROSS REFERENCES TO RELATED APPLICATIONS

This application claims the priority benefit of PCT/EP2007/009471 filed on Oct. 31, 2007 and German Application No. 10 2006 051 756.3 filed on Nov. 2, 2006. The entire contents of these applications are hereby incorporated in their entirety.

BACKGROUND

The invention relates to a light source comprising a primary radiation source and a luminophore, and to a process for producing such a light source. The invention relates especially to a process for producing an electrical light source using one or more luminophores which emit in the visible spectral region and at least one primary source which emits preferably in the UV and is preferably but not exclusively an LED.

SUMMARY OF THE INVENTION

Light sources based on at least one LED are realized through combination of a primary source which emits in the UV and one or more luminophores which are excited by the UV light of the primary source and emit in the visible spectral region. In an illustrative embodiment, a Ga(In)N LED which emits at about 460 nm and a yellow-emitting YAG: $Ce^{3+}$ luminophore (WO 98/12757) are used. When the aim is a pure white light source, a plurality of different luminophores have to be used, generally one material each emitting in the red, green and blue. According to the prior art, these have to be adjusted to an optimal particle size in each case and generally provided with a transparent protective layer. Finally, they are applied, as a mixture or embedded individually into a polymer matrix, to the primary source, for example a Ga(In)N LED (WO 2006/061778 A1 and U.S. 2003/0052595 A1). This process comprises several independent steps and is obviously very complex. Furthermore, in the interests of a high lifetime of the illuminants, high demands are made on the UV and thermal stability and the optical transparency of the protective layers and polymer matrix. In particular, in view of the fact that the new LED-based light sources will be mass-market products, the production process should have a high potential for automated and hence inexpensive production.

It was thus an object of the present invention to overcome the outlined disadvantages of the prior art and more particularly to provide a light source which can be produced in a simple manner, and which enables the emission of white light.

This object is achieved in accordance with the invention by a light source comprising (i) a primary radiation source and (ii) a luminophore layer or a luminophore based on an amorphous or partly crystalline network, said network comprising nitrogen (N) and at least two elements selected from P, Si, B and Al, and at least one activator being incorporated into the network.

The inventive light source comprises, as constituent (i), a primary radiation source. This primary radiation source can in principle emit light in any desired wavelength range. It preferably provides UV radiation, especially within a wavelength range from 250 to 450 nm, more preferably from 300 to 430 nm. More preferably a peak maximum of the emission of the primary radiation source is within the ranges specified.

The primary radiation source is more preferably an LED (light-emitting diode), especially a GaN or Ga(In)N LED. The light emitted by the primary radiation source is also referred to herein as primary radiation.

The inventive light source further comprises a luminophore layer and a luminophore, respectively, based on an amorphous or partly crystalline network, said network comprising N and at least two elements selected from P, Si, B and Al, and at least one activator being incorporated into the network.

The luminophores used in accordance with the invention are notable especially in that they are not substances based on a crystalline network, but rather substances based on an amorphous or partly crystalline network. The base materials used to form the luminophore have networks which are especially X-ray-amorphous, i.e. they have no crystals with a diameter of $\geq 300$ nm, especially no crystals with a diameter of $\geq 200$ nm and even more preferably no crystals with a diameter of $\geq 100$ nm. The base material of the luminophores thus especially has no long-range lattice symmetry whatsoever. Additionally incorporated into the network of the base material in the luminophores is at least one activator. In contrast to conventional crystalline luminophores, there is no exchange of ions present beforehand in the base material for activators, and the activators are instead incorporated additionally. This brings the significant advantage that any desired activators can be incorporated into the same matrix, and it is thus possible to provide luminophores which comprise different activators.

DETAILED DESCRIPTION

The base material of the inventive luminophores, which comprises an amorphous or partly crystalline network, comprises at least two elements selected from P, Si, B, Al and also, independently thereof, always N. In particular, the network consists of the elements P, Si, B, Al and N, or the particular subsystems of P, Si, B and N, P, Si, Al and N, Si, B, Al and N, P, B, Al and N, P, Si and N, P, B and N, P, Al and N, Si, B and N, Si, Al and N or B, Al and N. Suitable activators are incorporated into this network. The activators incorporated into the inorganic amorphous or partly crystalline network may especially be any desired metal ions. Preferred activator elements are Ba, Zn, Mn, Eu, Ce, Pr, Nd, Sm, Tb, Dy, Ho, Er, Tm, Yb, Sn, Sb, Pb or Bi. The activators are preferably $Mn^{2+}$, $Zn^{2+}$, $Ba^{2+}$, $Ce^{3+}$, $Nd^{3+}$, $EU^{2+}$, $Eu^{3+}$, $Gd^{3+}$, $Tb^{3+}$, $Sn^{2+}$, $Sb^{3+}$, $Pb^{2+}$ or $Bi^{3+}$. The amount of activators in the luminophore is preferably $\geq 0.1\%$ by weight, especially $\geq 0.5\%$ by weight, and preferably up to 14% by weight, especially up to 5% by weight. The activators may also have a sensitizer function.

The luminophore emits preferably at wavelengths between 480 and 740 nm. The luminophore preferably absorbs the primary radiation very substantially completely. It is additionally preferred that the light emitted by the luminophore has different wavelengths than the light absorbed. Since, in accordance with the invention, there is no exchange but instead an introduction of the activator elements, it is also possible for any desired combinations of activator elements to be introduced into the luminophore and thus, more particularly, for the emission colors to be adjusted as desired. More preferably, the activators are combined such that white light is emitted.

More preferably in accordance with the invention, suitable activators are incorporated into an amorphous three-dimensional network of the composition Si/B/N. This host material has no periodic lattice symmetry whatsoever.

Owing to advantageous effects on the crystal field strengths for the activators, and in order to achieve a high thermal and mechanical stability, the base material structure is preferably of nitridic nature, which may optionally be doped oxidically.

According to the invention, the luminophore or the luminophore layer may further comprise fillers. Preference is given to solid particles as fillers, which at the same time have a light-scattering action. Such solid particles are, for example, $SiO_2$, $TiO_2$, $SnO_2$, $ZrO_2$, $HfO_2$ and/or $Ta_2O_5$. The solid particles preferably have a narrow particle size distribution, the mean of the particle size distribution, depending on the refractive index of the particular material, preferably being selected such that white light is scattered optimally.

The layer thickness of the luminophore or of the luminophore layer is preferably between 200 and 3000 nm, especially between 300 and 2000 nm.

According to the invention, the luminophore layer may be in direct contact with the primary radiation source, i.e. be applied directly to the primary radiation source. However, it is also possible to arrange the luminophore layer in indirect contact with the primary radiation source, which means that further materials or layers are arranged between the primary radiation source and the luminophore layer. The intermediate layers or intermediate materials for the primary radiation are preferably completely transparent.

The invention further relates to a process for producing a light source as described herein, which is characterized in that a luminophore precursor is applied directly or indirectly in liquid form or as a suspension to a primary radiation source and then hardened.

The invention provides, more particularly, a process for liquid-phase coating of a primary source with a luminophore which emits in the visible spectral region. The process according to the invention is based on a new family of luminophores consisting of an amorphous matrix, into which all conceivable activators can be introduced in widely variable concentrations. This very advantageous feature is brought about by virtue of the fact that the activators are incorporated not substitutively, i.e. replacing a matrix atom, but instead additively.

This novel class of luminophores is obtained proceeding from molecular precursors via an oligomeric or polymeric intermediate and the final step of a pyrolysis. When the molecular precursors with the activators dissolved therein or the partly crosslinked preceramic oligomers are liquid, they can be applied, for example, by dip-coating, spin-coating or spray-coating, then fully crosslinked by heating in an ammonia atmosphere and converted to a firmly adhering ceramic layer by pyrolysis.

In a first preferred embodiment, a mixture of at least one molecular precursor, at least one activator and optionally fillers is formed and applied to the primary source. This is followed by hardening, especially by ammonolysis and subsequent pyrolysis. The viscosity of the mixture to be applied to the primary source can be adjusted here by the type and the content of the fillers.

In a further preferred embodiment, a mixture of at least one molecular precursor, at least one activator and optionally fillers is likewise applied to the primary source, although this mixture has first been subjected to a partial hardening, for example a partial ammonolysis, in order to adjust the viscosity to the desired value. This is followed by the application to the primary source and, thereafter, the hardening to completion, for example by ammonolysis and pyrolysis.

In a further preferred embodiment, the molecular precursors, the activators and optionally fillers are first used to form a preceramic polymer. This preceramic polymer is obtained, for example, by a complete ammonolysis. This preceramic polymer is then applied to the primary source. Liquid preceramic polymers can be applied directly. If the preceramic polymer is resinous or solid, a fine suspension of the preceramic polymer in a solvent is advantageously formed, and this suspension is applied to the primary source. The solvent is then evaporated and the luminophore layer is subsequently hardened, for example by pyrolysis.

It is additionally possible in accordance with the invention to add conventional solid pulverulent luminophores to the starting materials for the luminophore layer. Such an addition can result in fine adjustment of the emission.

The base material of the luminophores used in accordance with the invention is obtainable especially via molecular precursors which are processed to a preceramic material which is then converted to the final ceramic state by pyrolysis. The luminophore can be applied to the radiation source in the form of a molecular precursor or be formed from a molecular precursor.

To this end, one or more molecular precursors are first provided. The molecular precursors contain the elements of the base material, i.e. more particularly, at least two elements, preferably at least three elements, selected from P, Si, B and Al. The concentrations of P, Si, B, Al are preferably adjusted in each case between 0 and 100 atom %, more preferably between 10 and 80 atom %. The molecular precursors are more preferably halides, preferably chlorides.

It is possible to use several molecular precursors as the starting material, especially a mixture of molecular precursors which are then subjected to a co-ammonolysis. Mixtures of molecular precursors can be obtained, for example, by mixing a silazane and a boron halide and/or phosphorus halide.

In a further embodiment, a molecular precursor is used, which is a one-component precursor. Such a one-component precursor already contains all elements of the product. Particular preference is given to using, as the starting point of the preparation, the molecular compound $Cl_3Si(NH)BCl_2$ (TADB), which already contains the Si—N—B linkage desired in the end product.

Further preferred molecular one-component precursors are $Cl_4P(N)(BCl_2)SiCl_3$, $Cl_3PNSiCl_3$, $(Cl_3Si)_2NBCl_2$, $Cl_3SiN(BCl_2)_2$, $(H_3Si)_2NBCl_2$, $Cl_3Si(NH)(BCl)(NH)SiCl_3$, $Cl_3Si(NH)(AlCl)(NH)SiCl_3$, $[(Cl_3Si)(NH)(BNH)]_3$, $(Cl_3Si(NH)AlCl_2)_2$ or $[Cl_3PN(PCl_2)_2N]^+[AlCl_4]^-$.

The precursor material is then hardened to give a luminophore which comprises an amorphous or partly crystalline network. The hardening is effected preferably via the intermediate of a preceramic material. The luminophore precursors can be converted by ammonolysis, polycondensation and pyrolysis to amorphous networks composed of the corresponding elements which are joined to one another by nitrogen. Nitrogen can be replaced partially by oxygen, which affords oxidic doping.

Activators are incorporated into the luminophore layer, and are preferably introduced via the following routes.

Those metals which dissolve in liquid ammonia, like europium or barium, are initially charged dissolved in liquid ammonia, and the molecular precursor, e.g. TADB, is added dropwise. Conversely, the solution of the metals in ammonia can also be added dropwise to initially charged precursors, e.g. TADB. The polymeric imide amide formed contains, as well as the base material elements, for example as well as silicon and boron, also the activator element(s) in homogeneous distribution. The ceramic illuminant is obtained therefrom by pyrolysis.

Activators which do not dissolve in liquid ammonia in elemental form can be introduced in the form of complex molecular compounds. The ligands used should preferably contain only elements intrinsic to the system, such as halide (chloride), hydrogen, silicon or boron.

All other elements would be removable from the end product only with additional complexity, if at all. Particularly suitable metal complexes which are compatible with the system are, for example, those with $[Cl_3Si(N)SiCl_3]^-$ and chloride as ligands. Since all metals which are possible activators form binary chlorides from which the desired complexes can be prepared by reaction with $Li[Cl_3Si(N)SiCl_3]$, this route is universal. The complexes of the activators are dissolved in the molecular precursor, for example in TADB, or optionally dissolved together with the molecular precursor, for example with TADB, in a suitable solvent. This mixture or solution is added dropwise to liquid ammonia for the purpose of ammonolysis, or vice versa.

The thickness of the polymer/oligomer layer can be adjusted via the viscosity of the solution and the parameters of the coating process. The viscosity in turn can be adjusted in a controlled manner via the degree of polycondensation, i.e. through the mean molar mass of the oligomer, through addition of solvents, through addition of fillers and/or through the temperature. The fillers used are preferably materials which simultaneously have light-scattering action. Useful examples include SiO2, TiO2, ZrO2, SnO2 or Ta2O5 with a narrow particle size distribution around values which, depending on the calculation index of the material used, optimally scatter white light. The layer thicknesses are adjusted such that the pyrolysis gives rise to a crack-free ceramic layer. The layer thicknesses are preferably between 200 and 3000 nm, more preferably between 300 and 2000 nm. The layer thickness achievable in a coating operation depends essentially on the viscosity of the mixture to be applied and on the application process. If required for an optimal optical performance of the LED-based light source, the entire coating process may be repeated more than once in order to obtain the desired layer thickness.

The final curing to give the luminophore or to give the luminophore layer is effected preferably by pyrolysis to form an amorphous or partly crystalline network. In the pyrolysis, the preceramic imide amide obtained as an intermediate in the ammonolysis is converted to the end product at temperatures between 600° C. and 1500° C., preferably between 1000° C. and 1300° C. The pyrolysis takes place preferably in an atmosphere comprising nitrogen, argon, ammonia or mixtures thereof.

In a preferred embodiment, the layer applied is hardened in an ammonia atmosphere at room temperature to 200° C. Thereafter, the temperature is increased stepwise, for example to 620° C., and held at this temperature. This is followed by pyrolysis, for example at 1050° C. The heating elements used may be electrical resistance heating ovens or preferably infrared heaters, mirror ovens or lasers. The entire coating process can be carried out in parallel and continuously (in a conveyor belt-like manner). For example, the LEDs to be coated can be processed in parallel in a 100×80 matrix arrangement. Different durations of the individual process steps are balanced out at the same speed of travel by longer or parallel distances travelled.

The invetion claimed is:

1. A light source comprising
   (i) a primary radiation source and
   (ii) a luminophore layer based on a nitridic amorphous or partly crystalline network, said network comprising N and at least two elements selected from the group consisting of P, Si, B and Al, and at least one activator being incorporated into the network, wherein the network is not doped oxidically.

2. The light source of claim 1, wherein the activator is selected from the group consisting of Ba, Zn, Mn, Eu, Ce, Pr, Nd, Sm, Tb, Dy, Ho, Er, Tm, Yb, Sn, Sb, Pb and Bi.

3. The light source of claim 2, wherein the luminophore layer is based on a network of composition $Si_3B_3N_7$.

4. The light source of claim 3, wherein the primary radiation source emits light in the wavelength range from 250 to 450 nm.

5. The light source of claim 3, wherein the primary radiation source is an LED.

6. The light source of claim 4, wherein the primary radiation source is a $GaN^-$ or a Ga(ln)N LED.

7. The light source of claim 3, wherein the luminophore layer is in direct or indirect contact with the primary radiation source.

8. The light source of claim 3, wherein the luminophore layer comprises a luminophore which emits light at a wavelength between 480 and 740 nm.

9. The light source of claim 3, wherein the luminophore layer further comprises solid particles.

10. The light source of claim 9, wherein the solid particles are selected from the group consisting of $SiO_2$, $TiO_2$, $SnO_2$, $ZrO_2$, $HfO_2$ and $Ta_2O_5$.

11. The light source of claim 3, wherein the luminophore layer has a layer thickness between 200 and 3000 nm.

12. A process for producing a light source of claim 1, comprising, applying a luminophore precursor directly or indirectly in liquid form or as a suspension to a primary radiation source and then hardening the luminophore precursor.

13. The process of claim 12, wherein the luminophore is applied as a preceramic material.

14. The process of claim 13, wherein the luminophore is formed from a molecular precursor.

15. The process of claim 14, wherein the molecular precursor is a one-component precursor.

16. The process of claim 12, wherein the luminophore precursor is applied by dip-coating, by spin-coating or by spray-coating.

17. The process of claim 12, wherein the viscosity of the luminophore precursor is adjusted to from 0.01 to 10 Pa·s.

18. The process of claim 12, wherein the luminophore is applied in a plurality of layers.

19. The process of claim 18, wherein the luminophore precursor is hardened by pyrolysis.

20. A wavelength-converting material comprising a luminophore layer as defined in claim 1.

21. The process of claim 13, characterized in that the luminophore is applied as a preceramic oligomer.

22. The process of claim 15, wherein the one-component precursor is selected from $Cl_3Si(NH)BCl_2(TABD)$, $Cl_3PNSiCl_3$, $Cl_4P(N)(BCl_2)SiCl_3$, $(Cl_3Si)_2NBCl_2$, $Cl_3SiN(BCl_2)_2$, $(H_3Si)_2NBCl_2$, $Cl_3Si(NH)(BCl)(NH)SiCl_3$, $[(Cl_3Si)(NH)(BNH)]_3$, $Cl_3Si(NH)(AlCl)(NH)SiCl_3$, $(Cl_3Si(NH)AlCl_2)_2$ and $[Cl_3PN(PCl_2)_2N]^+[AlCl_4]$.

* * * * *